United States Patent [19]

Sonnenberg et al.

[11] Patent Number: 6,039,859

[45] Date of Patent: Mar. 21, 2000

[54] METHOD FOR ELECTROPLATING USING STABILIZED DISPERSIONS OF CONDUCTIVE PARTICLES

[75] Inventors: Wade Sonnenberg, Upton; Patrick J. Houle, Framingham; Thong B. Luong, Springfield; James G. Shelnut, Northboro; Gordon Fisher, Sudbury, all of Mass.

[73] Assignee: Shipley Company, L.L.C., Marlborough, Mass.

[21] Appl. No.: 09/082,437

[22] Filed: May 20, 1998

Related U.S. Application Data

[62] Division of application No. 08/626,636, Apr. 11, 1996, Pat. No. 5,800,739.

[51] Int. Cl.$^7$ ............................... C25D 5/02; C25D 5/54
[52] U.S. Cl. ..................... 205/159; 205/125; 205/161; 205/163; 205/166; 205/183
[58] Field of Search .................... 205/118, 125, 205/159, 161, 163, 166, 183, 920

[56] References Cited

U.S. PATENT DOCUMENTS

| | | | |
|---|---|---|---|
| 4,464,203 | 8/1984 | Belde et al. | 106/413 |
| 4,526,706 | 7/1985 | Upson | 252/500 |
| 4,619,741 | 10/1986 | Minten et al. | 205/125 |
| 4,819,437 | 4/1989 | Dayan | 60/673 |
| 4,834,910 | 5/1989 | Fuji et al. | 252/511 |
| 4,874,477 | 10/1989 | Pendleton | 205/125 |
| 5,389,270 | 2/1995 | Thorn et al. | 508/122 |
| 5,415,762 | 5/1995 | Allardyce et al. | 205/166 |
| 5,415,893 | 5/1995 | Wiersma et al. | 427/385.5 |
| 5,457,012 | 10/1995 | Nair et al. | 430/495 |
| 5,476,580 | 12/1995 | Thorn et al. | 205/122 |
| 5,542,969 | 8/1996 | Hirasa et al. | 106/31.78 |

OTHER PUBLICATIONS

Rhone–Poulenc Surfactants & Specialties, Nonionic Surfactants, pp. 30–43, 1994 month of publication not available.

Gottsfield et al., *J Electrochem. Soc.,* vol. 139, No. 1, Jan. 1992, pp. 14–15.

*Primary Examiner*—Kathryn Gorgos
*Assistant Examiner*—William T. Leader
*Attorney, Agent, or Firm*—Darryl P. Frickey; S. Matthew Cairns; Peter F. Corless

[57] ABSTRACT

The invention relates to a conductive dispersions used for diverse purposes such a base for electroplating nonconductors. The dispersion are characterized by use of a stabilizing quantity of a stabilizer having repeating alylkene oxide groups and a hydrophilic—lipophilic balance in excess of 12. It has been found that the stabilizers utilized in the subject compositions does result in a significant loss of conductivity in coatings formed from the dispersion.

9 Claims, No Drawings

METHOD FOR ELECTROPLATING USING STABILIZED DISPERSIONS OF CONDUCTIVE PARTICLES

This application is a divisional U.S. application Ser. No. 08/626,636 filed on Apr. 11, 1996, now U.S. Pat. No. 5,800,739.

BACKGROUND OF THE INVENTION

1. Introduction

This invention relates to aqueous dispersions of conductive particles. More particularly, this invention relates to stabilizing said dispersions using a polymeric surfactant having at least three alkylene oxide repeating units and a hydrophilic—lipophilic balance of at least 10.

2. Description of the Prior Art

Dispersions of conductive particles for formation of conductive coatings are known in the art. The conductive coatings formed using these dispersions are used for a variety of purposes such as a base for electroplating, for electromagnetic shielding and discharge, to make resistance heaters, as reflectors for radar dishes, as conductor paths for circuitry, etc. Typical dispersion of conductive particles include dispersions of carbon and graphite as illustrated in U.S. Pat. Nos. 4,818,437, 4,834,910, 4,874,477 and 5,476,580; metals such as silver, copper and palladium as illustrated in U.S. Pat. No. 5,500,106; metal salts such as metal oxides and sulfides as disclosed in U.S. Pat. Nos. 5,268,024 and 5,269,973; and organic polymers such as those illustrated in U.S. Pat. No. 5,415,762. Each identified patent is incorporated herein by reference for its disclosure of dispersions of conductive particle dispersions.

The use of coatings formed from dispersions of conductive particles for the formation of printed circuit boards is disclosed in U.S. Pat. No. 3,099,608, incorporated herein by reference. The process disclosed in this patent involves treatment of a nonconducting surface with a tin-palladium dispersion to form a poorly conducting film of colloidal palladium particles over the nonconducting surface. This is the same tin-palladium colloid used as a plating catalyst for electroless metal deposition. For reasons not fully understood, it is possible to electroplate directly over the catalyzed surface of the nonconductor from an electroplating solution though deposition occurs by propagation and growth from a conductive surface, such as the copper cladding used in the fabrication of a printed circuit board. Therefore, deposition begins at the interface of an adjacent conductive surface and the catalyzed nonconducting surface. The deposit grows epitaxially along the catalyzed surface from this interface. Metal deposition onto the substrate using this process is slow. Moreover, deposit thickness is uneven with the thickest deposit occurring at the interface with the conducting surface and the thinnest deposit occurring at a point most remote from the interface.

It is stated that an improvement to the process of U.S. Pat. No. 3,099,608 is described in UK Patent No 2,123,036 B, incorporated herein by reference. In accordance with the process described in this patent, a surface is provided with metallic sites by immersion in a dispersion of conductive particles such as metallic particles inclusive of tin-palladium colloidal particles. The surface is then electroplated from an electroplating solution containing an additive said to inhibit deposition of metal on a metal deposit formed during the plating reaction without inhibiting deposition on the metallic sites over the nonconducting surface. This is said to result in preferential deposition over the metallic sites with a concomitant increase in the overall plating rate. A commercial application of the process of the UK patent is for the metallization of through-holes walls in the manufacture of double sided printed circuit boards.

Further improvements in processes for direct electroplating of nonconductors in printed circuit manufacture are disclosed in U.S. Pat. Nos. 4,895,739; 4,919,768 and 4,952,286, each incorporated herein by reference. In accordance with the processes of these patents, a palladium dispersion, such as that disclosed in the UK patent, is treated with an aqueous solution of a chalcogen, such as a solution of a sulfur compound, to convert the catalytic surface to a chalcogenide surface. The chalcogenide of the electroless plating catalyst formed by conversion of the surface to a chalcogenide conversion coating is robust and suitable for electroplating. A shortened process for electroplating derived from the teachings of these patents and using a chalcogenide is disclosed in U.S. Pat. No. 5,276,290 incorporated herein by reference. In accordance with the process disclosed in this patent, a stable dispersion of a preformed catalytic chalcogenide is prepared. A non-conducting surface is contacted with the dispersion by immersion. Chalcogenide particles adsorb on the surface of the nonconductor. Following adsorption of the chalcogenide, the nonconductor is electroplated following procedures disclosed in the aforesaid U.S. Pat. Nos. 4,895,739; 4,919,768 and U.S. Pat. No. 4,952,286.

An alternative method for direct electroplating of nonconductors is disclosed in U.S. Pat. No. 4,619,741, incorporated herein by reference. In accordance with the procedures of this patent, a nonconductive substrate is coated with a dispersion of carbon black and then dried. The coating is removed from surfaces where plating is undesired and the remaining portions of the substrate are plated using procedures similar to those described in the aforesaid references. There are several problems inherent in this procedure. Carbon black is a poor conductor of electricity, and consequently, before forming the carbon black dispersion, in practice, it is believed that the carbon black particles must be treated with an organic ionomer or polymer to enhance conductivity. In addition, during processing, and prior to electroplating, the carbon black dispersion is only poorly adhered to the underlying substrate and has a tendency to flake off of the substrate prior to the plating step. This results in void formation during plating. In addition, because of the poor adherence to the substrate, subsequent to plating, there is a tendency for the metal deposit to separate from the substrate. This can lead to interconnect defects between a metallized hole and an innerlayer in multilayer printed circuit fabrication.

A more recently utilized direct plate process for metallizing the walls of hole-walls employs dispersions of graphite for the formation of a conductive coating. The use of graphite to form conductive coatings on through-hole walls is known and disclosed in U.S. Pat. No. 2,897,409 incorporated herein by reference. Current processes are disclosed, for example, in U.S. Pat. Nos. 4,619,741 and 5,389,270, each incorporated herein by reference. In accordance with the procedures of these patents, a dispersion of carbon black or graphite is passed through the through-holes of a printed circuit board substrate to form a coating of the dispersion on the hole-walls. The coating is dried to yield a conductive layer of the carbon black or graphite which is sufficiently conductive for electroplating in a conventional manner. In both the carbon and graphite processes, because of the poor conductivity of these materials relative to a metal, there is a tendency for the metal deposit to propagate from a conductive surface such as copper cladding in the fabrication of printed circuit boards. Therefore, the thickness of a deposit is uneven, thicker in the areas in closest proximity to the metallic layer and thinnest in the area most remote from the metallic surface. In addition, take-off time for initiation of deposition can be relatively slow, again as a consequence of the relatively poor conductivity of the carbonaceous coating.

In U.S. Pat. Nos. 5,484,518 and 5,500,106, each incorporated herein by reference, an alternative to the use of carbon and graphite dispersions is disclosed. In accordance with the procedure described in these patents, a dispersion of other conductive particles is used such as particles of metal, conductive metal salts and conductive oxides. As further disclosure within these patents, additional components are added to the dispersion such as conductive polymers, binders, surfactants and reducing agents.

Though the process of the aforesaid patents provides conductive coatings, in practice it has been found that due to the relatively large particle size of the particles in the dispersion, especially the carbon and graphite dispersions, the dispersions used are most often inadequately stable for prolonged storage prior to use. This limits the market for the dispersions or requires the addition of a stabilizer to stabilize the dispersion. It has been found that when a stabilizer is added to the dispersion to enhance stability, the stabilizer envelopes the particles within the dispersion and form an electrically insulative coating over the particles. Therefore, when the particles are coated onto a substrate, the particles which are initially poorly conductive, become less conductive because of the insulating layer of the stabilizer thereby further limiting the commercial use of the same.

SUMMARY OF THE INVENTION

The present invention provides a stabilizer suitable for long term stabilization of a dispersion of conductive particles which stabilizer does not significantly decrease conductivity of the particles, or a coating of the particles over a substrate formed from the dispersion.

The stabilizer of the invention comprises an alkylene oxide polymer having a hydrophilic—lipophilic balance (HLB) in excess of 10, more preferably, an HLB in excess of 12 and most preferably, in excess of 15. The preferred stabilizer is one having at least 3 alkylene oxide repeating units and more preferably, in excess of 10 alkylene oxide units which may be the same or different. The stabilizer is desirably added to the formulation at the time that the suspension is prepared and if possible, prior to formation of the particles.

The dispersion of the conductive particles is used in the same manner as conductive the particles discussed in the above referenced patents. It is an unexpected discovery of the invention that the stabilizers substantially increase shelf life of the dispersion without loss in conductivity of a coating of the particles of the conductive colloid adsorbed onto a substrate.

DESCRIPTION OF THE PREFERRED EMBODIMENTS

The stabilized dispersions of the subject invention are suitable for manufacture of a variety of commercial articles where a conductive coating is desired. However, the invention is especially useful for electrolytic metal plating, especially plating for fabrication of printed circuit boards requiring metallized through-holes. For this reason, the description that follows is directed primarily to printed circuit board manufacture. In the following description, the term "non-conductor" means an article having at least a portion of its surface inadequately conductive for direct electroplating. In the preferred embodiment of the invention, the term "nonconductor" refers to the electrically nonconducting portions of a printed circuit board base material such as a copper clad epoxy or phenolic sheet.

The dispersions stabilized in accordance with the invention are aqueous dispersions of conductive particles where the particle size of the dispersed particles have a mean diameter of between about 1 and 100,000 microns, dependent upon the particle dispersed. For example, conventional particles of graphite and carbon black might have a mean diameter within the upper end of the range and particles of palladium sulfide will have a mean diameter within the lower end of the range. Other conductive particles will have a mean diameter within the above stated range. The dispersions contain the dispersed particles within a concentration range of from about 0.01 to 25 percent by weight, but preferably are present within a range of from about 0.05 to 10 percent by weight, again dependent upon the specific particle within the dispersion. Particles of graphite and carbon black would be used in a higher concentration than particles of palladium tin alloy. Other particles would be present within the above stated range.

Conductive dispersed particles in accordance with the invention may be of carbon inclusive of graphite; metal including alloys such as copper, palladium, tin-palladium alloys, silver and nickel; metal compounds such as metal sulfides inclusive of palladium and nickel sulfide, metal oxides inclusive of copper oxide and palladium oxide; and organic such as polyanaline as described by Gill et al, "Novel Colloidal Polyaniline—Silica Composites," *J. P. Chem. Soc., Chem. Commun.*, 1992, pp. 108 and 109; by Armin at al, "Synthesis Of Novel Polyaniline Colloids Using Chemically Grafted Poly(N-vinyl pyrrolidone)—Base Stabilizers," *Journal of Colloid and Interface Science*, Vol. 150, No. 1, 1992, pp. 134–142, and by Bay at al, "Poly(1-vinylimidazole-co-4-aminostyrene): Steric Stabilizer For Polyaniline Colloids," *Polymer*, 1991, Vol. 32, No. 13, pp. 2456–2460, polypyrrole a disclosed by Armes et al, "Preparation and Characterization of Colloidal Dispersions of Polypyrrole Using poly(2-vinylpyridine)-based Steric Stabilizers," *Polymer*, 1390, Vol. 31, March, pp 569–574.

In accordance with the subject invention, it has been found that to provide prolonged stability without reducing conductivity of a coating of the particles, an alkoxylated stabilizer having an HLB in excess of 10 must be used. To have prolonged stability without a noticeable reduction in conductivity of a layer of the adsorbed colloid on a substrate, the alkoxylated stabilizer desirably has HLB of at least 12 and preferably, at least 15. One preferred class of stabilizers in accordance with the invention are those non-ionic polyethers having polyalkylene oxide blocks and conforming to the following formula:

RO[(CH$_2$)$_m$O]$_a$[(CH$_2$)$_{m'}$O]$_b$H where R is a hydrocarbon group having from 1 to 40 carbon atoms, m and m' differ from each other and each is one or more whole integers of from 2 to 4, preferably 2 or 3, and a and b are whole integers varying between 0 and 1000 provided that a+b is at least 3, preferably between 7 and 50. R may be aliphatic or aromatic. Exemplary aliphatic groups are ethyl, propyl, butyl, octyl, decyl, dodecyl, etc. Exemplary aromatic groups are benzyl and naphthyl, especially alkyl substituted benzyls. The formula above is intended to include copolymers such as mixed alkylene oxide including copolymers containing ethylene oxide and propylene oxide blocks.

Another class of preferred stabilizers are electrosteric stabilizers having the requisite HLB and an ionic charge chemically bonded to the end of a hydrophilic nonionic moiety and at least twenty ethylene oxide groups in its chain conforming to the following structural formula:

$$RO[(CH_2)_mO]_a[(CH_2)_{m'}O]_bH$$

where R, m, m', a and b are as defined above, R' is an alkyl group having from 1 to 8 carbon atoms, A is an anion such as carboxylate, phosphate, sulphonate, etc., and M is a counteracting cation such as an alkali metal inclusive of sodium and potassium; anmmonium; or an alkaline earth metal such as calcium or magnesium. A more preferred stabilizer within the above class is one where R is alkyl having from 10 to 20 carbon atoms, A is—SO$_3$, n is an odd number and M is sodium.

A preferred stabilizer within the above class of materials conforms to the formula:

$$C_{m''}H_{2m''+1}(OC_2H_4)_nOSO_3M$$

where m" is a whole integer ranging between 3 and 20, M is an alkali metal and n varies between 3 and 1,000 and preferably, between 7 and 50.

Other surfactants suitable for use in accordance with the invention include alkylphenol ethoxylates, alcohol ethoxylates, tristrylphenol ethoxylates and mercaptan ethoxylates, all sold under the trade name Ipegal or Rhodasurf, and oleyl alcohol ethoxylates also sold under the Rhodasurf tradename.

With respect to HLB values given above, it should be understood that the numerical values given are for systems utilizing water as the dispersant for the conductive particles. If a water miscible organic solvent such as an alcohol is added to the dispersant for the particles, the polarity of the dispersant will normally be reduced. The desired HLB of the stabilizer should be altered, typically reduced, in proportion to the reduction in the polarity of the dispersant. The change in HLB may have to be determined by routine experimentation.

The concentration of the stabilizer in suspension may vary from about 0.1 to 20 parts by weight per part of dispersed phase and preferably varies between about 0.5 and 2 parts per part of dispersed phase. Preferably, and where possible, the suspending agent is added to the dispersant prior to formation of the particles whereby the particles are stabilized as they are formed.

One desirable class of materials stabilized with the stabilizers of the invention are preformed colloids of metal sulfide having a particle size not exceeding 100 nm and characterized by particles that are uniform in shape, have a controlled particle size and a controlled particle size distribution. Desirably, particles within the dispersion are spherical and have a mean diameter not exceeding 100 nm where mean diameter is defined as the average diameter of all of the particles within the dispersion. A preferred method for formation of this dispersion comprises controlled double jet precipitation. Preparation of monodispersed particles by controlled double jet precipitation is disclosed by Stavek et al, Chem. Mater. 1992, 4, 545–555, incorporated herein by reference. The process comprises controlled addition of separate solutions of the reactants—i.e., the anion and cation solutions, to a reactor containing a dispersant for the particles formed. A reactor is provided with inlet lines for introduction of both reactants. The reactor is equipped with heating jacket for temperature control of the reaction as desired. The reactor is further equipped with a thermometer and stirring rod. The reactor may also be equipped with condenser to prevent evaporation of dispersant from the reactor.

In use of the above described reactor to make a palladium sulfide dispersion, the reactor is charged with a suitable liquid dispersant for the particles, typically an aqueous dispersant desirably containing the surfactant of the invention. The stirring rod is used to agitate the dispersant. Temperature is regulated to the desired reaction temperature. The reactants are introduced into the reactor through their respective feed lines. Addition of the reactants is by slow metering into the reactor using control means such as a peristaltic pump. Flow rate is dependent upon the size of the reactor. For example, using 100 ml of dispersant for purposes of illustration, the reactants may be fed to the reactor at a rate of from about 0.01 to 1.0 moles per minute and preferably, in the stoichiometric ratio required to form a precipitate. The reaction continues until all of the reactants are fed into the reactor. Stirring is continued after completion of the reaction, typically for a time of from 5 minutes to 1 hour.

The reactants are solutions of an anion and cation capable of reacting to form the desired particle, preferably a noble metal sulfide. Reactants capable of forming palladium sulfide are especially preferred. Each reactant is dissolved in an aqueous solution. Each of the cation and anion solutions may contain the ion in a concentration range of from about 0.00001 to 0.1 moles per liter and more preferably, within a range of from about 0.005 to 0.5 moles per liter. The feed rate of each to the reactor is dependent upon the stoichiometry of the reaction and the concentration of the reactant in the solution. The dispersant solution is preferably water containing the surfactant and a pH adjuster as necessary. Preferred metallic cations are noble metals, especially platinum and palladium. Copper and nickel may be used but they are lesser preferred. In general, any metal ion capable of reacting with a sulfur compound to form a metallic sulfide particle essentially as electrically conductive as palladium sulfide is suitable.

A method for formation of a dispersion of a conductive polymer in accordance with the invention comprises formation of a solution of the stabilizing agent, other additives as desired and monomer. Thereafter, oxidant is added with agitation to form the polymer in the presence of the stabilizing agent and to disperse the polymer in its dispersant. Reaction conditions are in air at room or slightly below room temperature as necessary to dissolve the reactants. The monomers, oxidants, solvents and reaction conditions are as described in the above cited references illustrating the formation of conductive polymer colloids.

Another useful dispersion in accordance with the invention uses particles of carbon black (amorphous), graphite (crystalline), or a mixture of the two. The carbon may be present in the dispersion preferably in an amount of from about 0.5 to about 10% by weight of the dispersion. The carbon may have a mean particle size within a range of from about 0.05 to about 50 microns and typically is of a particle size within a range of from about 0.3 to 5.0 microns. Graphite particles of suitable size can be prepared by the wet grinding or milling of raw graphite having a particle size greater than 50 microns, to form a slurry of smaller particles. Graphite particles of suitable size can also be formed by graphitizing already-small carbon-containing particles. If both carbon black and graphite are used, the carbon black may have a substantially smaller particle size than the graphite. The ratio of graphite to carbon black may vary from about 1:100 to about 100:1, and preferably from about 1:10 to about 10:1.

The carbon black used to form a dispersion can be substantially as described in U.S. Pat. No. 5,139,642 incorporated herein by reference. Several commercial carbon blacks contemplated to be useful include CABOT MONARCH 1300, sold by Cabot Corporation, Boston, Mass.; CABOT XC-72R Conductive, from the same manufacturer; ACHESON ELECTRODAG 230, sold by Acheson Colloids Co., Port Huron, Mich. and COLUMBIAN RAVEN 3500, made by Columbian Carbon Co., New York City, N.Y. The graphite can be substantially as described in U.S. Pat. No. 5,139,642 and may be either synthetic or natural. Suitable commercial graphites and graphite dispersions contemplated to be useful herein include: ULTRAFINE GRAPHITE, sold by Showa Denko K.K., Tokyo, Japan; AQUADAG E, sold by Acheson Chemical Company; MICRO 440, sold by Asbury Graphite Mills Inc., Asbury, N.J.; GRAPHITE 850, also sold by Asbury; GRAFO 1204B, sold by Metal Lubricants Company, Harvey, Ill.; GRAPHOKOTE 90, sold by Dixon Products, Lakehurst, N.J.; NIPPON AUP (0.7 micron), sold by Nippon Graphite Industries, Ltd., Ishiyama, Japan; and others having similar electrical and dispersion characteristics.

Another component of conventional carbonaceous dispersions used for the formation of conductive coatings is a water soluble or dispersible binding agent to bind the carbon particles. The binding agent is believed to assist the dispersed carbon particles in adhering to the surface of the non-conductive (i.e., dielectric) substrate which is to be made conductive for electroplating. The binding agent may be present as from about 0% to about 15% by weight, and preferably from about 0.2 to about 10% by weight. The binding agent may be a natural or synthetic polymer, polymerizable monomer, or other viscous or solid material (or precursor thereof) that is capable of adhering to the carbon particles such as a carbohydrate, an anionic polymers, an acrylic, vinyl resins, etc.

The carbon dispersion is made in accordance with conventional methods such as by adding the carbon black to the dispersant with vigorous agitation or by ball milling the components together and then dispersing the ball milled material in a dispersant with agitation. The surfactant of the invention is desirably added at the time the carbon black is dispersed in the dispersant dispersant.

The following description illustrates the manner in which the dispersion of the invention may be used in printed circuit board manufacture though the invention is not limited to this use. For circuit manufacture, the substrate commonly used is an epoxy substrate filled with glass fibers and copper clad on at least one of its surfaces. As is known in the art, the epoxy may be mixed with other resins for specific purposes.

In the manufacture of a double sided printed circuit board, a first step comprises the formation of through-holes by drilling or punching or any other method known to the art. Following formation of the holes, it is desirable to employ the conventional step of desmearing the holes (step 1 above) using sulfuric acid or chromic acid or by plasma etching or etch back of the holes with chromic acid. Following desmearing or etch back of the holes, the circuit board base material is conventionally treated with a glass etch that removes glass fibers extending into the holes from the hole walls. This is followed by a solution that cleans the copper surface and conditions the hole wall to promote catalyst adsorption. Such solutions are often referred to as cleaner conditioners and typically comprise an aqueous alkaline surfactant solution for cleaning soil and a polyamine or quaternary amine to condition the hole wall and impart a positive charge to facilitate adsorption of a negatively charged colloidal catalyst. This treatment step, by itself, is old in the art and does not constitute a part of the invention. Proprietary cleaner conditioners are commercially available, and a suitable material is available from Shipley Company, L.L.C. of Marlboro Ma. and identified as cleaner conditioner 231

Following the above preparation steps, the processing sequence of the invention may be employed. The next step in the process comprises immersion of the part to be plated in the solution of the dispersion of conductive particles. The treatment conditions for immersion of a part in the dispersion are not critical. Preferably, treatment times vary from about 30 seconds to 30 minutes and more preferably, vary between about 5 and 20 minutes. The temperature may vary from about −30° C. to near the boiling point of the dispersion, but below room temperature treatment is preferred.

Treatment with the dispersion results in the formation of an adsorbed layer of conductive particles over the nonconductor surface. The adsorbed layer darkens the surface. The coating is suitable for direct electroplating or any other use such as those mentioned above. If the nonconductor is a copper-clad printed circuit base material, the copper cladding should be cleaned such as, for example, by use of a sulfuric acid—hydrogen peroxide etchant. The etchant should be used at room temperature for a period of time ranging between about 1 and 3 minutes.

The next step in the process of making a printed circuit board comprises electroplating directly over the adsorbed coating of the conductive particles. The electroplating procedure is similar to the procedure disclosed in the above referenced UK Patent. The electroplating process may use electroplating solutions such as those disclosed in the UK Patent, but most commercially available electroplating solutions contain additives which make the same suitable for the process of the invention. The preferred electroplating metals in accordance with the invention are copper and nickel though the process is suitable for electroplating of any desired metal. A typical electroplating solution comprises an aqueous acid solution of the metal desired to be plated together with proprietary additives from the group of dyes, surfactants, chelating agents, brighteners, leveling agents, etc. Typical acids used in the formulation of said baths comprise those with a high ionic dissociation constant for maximum conductivity such as sulfuric acid, fluroboric acid, sulfamic acid, etc. Dyes typically used in such baths include methylene blue, methyl violet, and other n-heterocyclic compounds. Suitable surfactants included in such baths typically include nonionic surfactants such as alkyl phenoxy polyethoxyethanols, wetting agents and water soluble organic compounds such as compounds containing multiple oxyethylene groups have been found to be effective. A preferred group of such compounds include polyoxyethylene polymers having from as many as 20 to 150 repeating units. Also included in this class of materials are block copolymers of polyoxyethylene and polyoxypropylene. The additives described above are added to the solution in conventional concentrations.

The electroplating procedure is conventional. A part to be plated is used as a cathode in a conventional electroplating cell. Current density is conventional and varies typically within a range of from 5 through 40 amps per square foot, depending upon the diameter of holes to be plated, the thickness of the board and the composition of the electroplating solution used. The plating solution is maintained at a temperature ranging between room temperature and about 100° F. Plating is continued for a time sufficient to form a deposit of desired thickness. For circuit board manufacture, a typical thickness may range between 0.5 and 2.0 mils, typically from 1 to 1.5 mils. A plating time of from 15 to 90 minutes would typically be required to obtain a deposit of the preferred thickness within the preferred range of current densities. The deposit formed by the process is uniform in thickness, free of defects and strongly bonded to the surface of the nonconductor over which it is plated. Bond strength is satisfactory to withstand soldershock testing as conventionally used in printed circuit board manufacture.

The invention will be better understood by reference to the examples that follow where, unless stated otherwise, the substrate treated was an epoxy copper clad circuit board base material provided with a random array of through-holes. Commercial formulations used in the examples are available from Shipley Company, L. L. C. of Marlborough, Mass.

EXAMPLE 1

For this example, a double jet precipitator having a volume of 300 cm$^3$ had added to it 100 cm$^3$ of an aqueous solution of 1.50 g of Avanol surfactant S-150, an ethoxylated sulfonate having ethylene oxide chain lengths of 15. Using peristaltic pumps, 50 cm$^3$ of a solution 0.020 mol dm$^{-3}$ PdCl$_2$ acidified with 0.1 cm$^3$ of concentrated HCl and 50 cm$^3$ of 0.020 mol dm$^{-3}$ Na$_2$S solution were separately fed to the reactor at a rate of 10 cm$^3$ per minute. The system was stirred at 600 rpm at room temperature. A dispersion was formed having spherical PdS particles with a diameter of 20±3 nm. The so prepared dispersion was stable. No aggregation or settling was observed after aging the dispersion for four weeks in an oven at 49° C.

EXAMPLE 2

The procedure of Example 1 was repeated six times using 50 cm$^3$ of 0.050 mol dm$^{-3}$ CuSO$_4$ and 50 cm$^3$ of a 0.050 mol dm$^{-3}$ Na$_2$S solution introduced by means of peristaltic pumps into 100 cm$^3$ aqueous solution containing 1.5 g of the Avanol S-150 surfactant solution. Each experiment differed in reaction temperature. The reaction temperatures used were 30° C., 40° C., 50° C., 60° C., 70° C. and 80° C. Copper sulfide dispersions were formed that were stable after aging for four weeks in an oven at 49° C.

EXAMPLE 3

Using the procedure of Example 1, 0.020 mol dm$^{-3}$ of Na$_2$[PdCl$_4$] was substituted for the PdCl$_2$ solution without addition of HCl. The colloid formed exhibited the same adsorption and stability properties as the colloid of Example 1.

EXAMPLE 4

This example illustrates the use of dispersions to construct a printed circuit board.

A copper clad epoxy board material having an array of through holes having diameters of 14, 18 and 24 mils was prepared for plating by contact with a pretreatment solution identified as cleaner conditioner 231 available from Shipley Company, L. L. C. and containing a proprietary amine surfactant and water rinsed. The cleaner conditioner cleans the copper and imparts a positive charge to the surface of the board. Treatment is by immersion for 5 minutes in the treatment solution maintained at about 45° C. The so treated board is then immersed in the palladium sulfide colloid formed by the process of Example 1. Treatment is for 5 minutes in the colloidal suspension maintained at a temperature varying between 25 and 30° C. Following treatment with the colloidal suspension of palladium sulfide, there is some darkening of copper indicating that some copper sulfide formed. This is removed by immersion of the substrate in a peroxide sulfuric etchant identified as Pre-etch 746 etchant for 30 to 60 seconds at room temperature. Thereafter, the part is water rinsed and electroplated from an acid copper electroplating bath identified as Electroposit 892 acid copper at a current density of 15 amps/sq. ft. and at a temperature of 70° F. for three minutes. Complete coverage with electrolytic copper occurs after only 3 minutes though the longer plating time was used to permit deposition of an adequately thick layer of copper.

EXAMPLE 5

The preformed palladium sulfide colloid of Example 1 was stored in an oven maintained at 120° F. for 20 days. No precipitation nor aggregation was observed following this storage. Following storage, the colloid was used to fabricate a double sided circuit board using the procedure of Example 4. Similar results were obtained.

EXAMPLE 6

A solution was formed consisting of 200 ml of deionized water and 3 gms of a stabilizer identified as Igepal CO990 FLK having in excess of 100 moles of ethylene oxide repeating units and an HLB in excess of 19. A dopant in an amount of 2.8 grams is then added. The dopant used was paratoluene sulfonic acid available from Aldrich Chemical Company. Thereafter, 2.0 gms of pyrrole and 80 mls of water are added. The colloid is then formed by the slow addition of 17.7 ml of a 40 weight percent solution of sodium persulfate. All additions are made with mild agitation. Stirring is continued for thirty minutes following the addition of the sodium persulfate. A black suspension was formed and identified as polypyrrole.

EXAMPLE 7

This example illustrates plating of a double sided through-hole board using the conductive polymer suspension of Example 6.

A drilled copper clad epoxy/glass FR4 multilayer printed circuit board panel was desmeared by immersion in MLB Conditioner 3302 for 5 minutes at 165° C., cold water rinsed, then immersed in alkaline permanganate solution MLB Promoter 3308 for 6 minutes at 165° C., cold water rinsed, then Neutralizer 3314 for 2 minutes at 25° C. and cold water rinsed. All cold water rinses were for 2 minutes. The so treated panel was then immersed in Cleaner Conditioner XP9420, an aqueous alkaline solution consisting of a cationic polymeric surfactant for 5 minutes at 40° C. and cold water rinsed at room temperature for 2 minutes. The panel was then immersed in the polymer suspension of Example 6 at room temperature for 5 minutes and cold water rinsed at room temperature for 60 seconds. The panel was then subjected to a final etch in peroxyacetic acid at a temperature 34° C. for 1.5 minutes and then plated at room temperature at 2 amps per dm$^2$ in an acid copper electroplating solution identified as EP-1000 for 60 minutes. The deposit was continuous over the epoxy/glass substrate in the drilled through-holes and well adhered to the hole wall surfaces.

EXAMPLE 8

The procedure of Example 7 was repeated using the conductive polymer of Example 6 after storage for 30 days at room temperature in a sealed bottle. Similar results were obtained.

EXAMPLE 9

The procedures of Example 6 was repeated, but the stabilizer used was polyvinylpyrrolidone. Prior to storage, metal would deposit on the substrate but voids in the plating were evident. Following 30 day storage, metal would not deposit from the electroplating solution.

EXAMPLE 10

The procedure of Example 6 was repeated using a conductive polymer stabilized with an ethylene oxide polymer identified as Avanol S150, an electrosteric stabilizer that is the sodium salt of a sulfonic acid having 15 repeating ethylene oxide groups and an HLB of 15.4. Similar results were obtained as in Example 6. The freshly prepared conductive polymer colloid was then used in the process of Example 7. Again, similar results were obtained.

EXAMPLE 11

The procedure of Example 6 was repeated using a stabilizer identified as Pluronics F127 available from BASF. The stabilizer is a polyoxyethylene-polyoxypropylene block copolymer having a molecular weight of 12,600 and an HLB betweem abpit 18 and 23. Similar results were obtained. The freshly prepared colloid was then used in the process of Example 7 and again, similar results were obtained.

EXAMPLE 12

The procedure of Example 6 was repeated substituting Rodasurf TB970 for the surfactant used in Example 6. The Rhodasurf stabilizer is a linear alcohol ethoxylate with and HLB of 19. Similar results were obtained.

Examples 1, 6 and 12 constitute the currently preferred embodiment of the invention.

What is claimed is:

1. A method for plating a metal over a substrate, said method comprising the steps of forming a conductive coating over said substrate by contacting said substrate with a stable aqueous dispersion of discrete graphite particles, said dispersion comprising said graphite particles dispersed in an aqueous medium and stabilized with a stabilizing quantity of a polymeric stabilizer having repeating alkylene oxide groups and a hydrophilic—lipophilic balance (HLB) in excess of 10 and thereafter, electroplating over said so formed conductive coating.

2. The method of claim 1 where the stabilizer has an HLB in excess of 12.

3. The method of claim 1 where the concentration of the stabilizer in the dispersion varies from about 0.1 to 20 parts by weight per part of the dispersed phase.

4. The method of claim 1 where the repeating alkylene oxide groups are a mixture of ethylene oxide and propylene oxide groups.

5. The method of claim 1 where the number of repeating alkylene oxide groups varies from 3 to 1,000.

6. The method of claim 5 where the number of repeating alkylene oxide groups varies from 10 to 50.

7. The method of claim 1 where the stabilizer conforms to the formula:

$$RO[(CH_2)_mO]_a[(CH_2)_{m'}O]_bH$$

where R is a hydrocarbon group having from 1 to 40 carbon atoms, m and m' differ from each other and each is a whole integer of from 2 to 4, and a and b are whole integers varying between 0 and 1,000 provided that a+b is at least 3.

8. The method of claim 7 where R is aliphatic.

9. The method of claim 7 where R is aromatic.

* * * * *